United States Patent
Patel et al.

(10) Patent No.: US 9,568,520 B2
(45) Date of Patent: Feb. 14, 2017

(54) FREQUENCY DETECTION CIRCUITS

(71) Applicant: Hamilton Sundstrand Corporation, Charlotte, NC (US)

(72) Inventors: Sunil S. Patel, Rockford, IL (US); Frank J. Ludicky, Machesney Park, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 175 days.

(21) Appl. No.: 14/279,919

(22) Filed: May 16, 2014

(65) Prior Publication Data
US 2015/0331026 A1 Nov. 19, 2015

(51) Int. Cl.
*G01R 23/02* (2006.01)
*G01R 1/30* (2006.01)
*G01R 23/15* (2006.01)

(52) U.S. Cl.
CPC .............. *G01R 23/02* (2013.01); *G01R 1/30* (2013.01); *G01R 23/15* (2013.01)

(58) Field of Classification Search
CPC ............ G01R 23/02; G01R 23/15; G01R 1/30
USPC .......................................................... 324/76
See application file for complete search history.

(56) References Cited

U.S. PATENT DOCUMENTS

| | | | | | |
|---|---|---|---|---|---|
| 4,267,514 A | * | 5/1981 | Kimsey | ................ | H03D 13/003 327/12 |
| 5,497,110 A | * | 3/1996 | Smith | .................... | G01R 31/42 327/42 |
| 5,610,561 A | * | 3/1997 | Zarrabian | ............ | A61N 1/3931 327/292 |
| 6,100,721 A | * | 8/2000 | Durec | .................... | G01R 25/00 327/12 |
| 6,560,305 B1 | * | 5/2003 | Croughwell | ............ | H03L 7/085 327/147 |
| 2001/0017555 A1 | * | 8/2001 | Flecheux | ............. | H03K 23/665 327/117 |
| 2010/0156482 A1 | * | 6/2010 | Sundby | ................. | H03L 7/0891 327/156 |
| 2014/0021927 A1 | | 1/2014 | Klapatch et al. | | |

OTHER PUBLICATIONS

TimerBlox: Monostable Pluse Generator (One Shot) Specifications by Linear Technology.
Specifications for Single Positive-Edge-Triggered D-Type Flip-Flop With Clear and Preset by Texas Instruments.
Specification for Pulse Qualifier; TimerBlox: Delay Block/ Debouncer by Linear Technology.

* cited by examiner

*Primary Examiner* — Son Le
*Assistant Examiner* — Akm Zakaria
(74) *Attorney, Agent, or Firm* — Locke Lord LLP; Scott D. Wofsy; Christopher J. Cillié

(57) ABSTRACT

A frequency monitoring circuit includes a monitoring lead, a D-type flip-flop, and a one-shot. The D-type flip-flop has a switchable logic state, a clear input, and a clock input. The one-shot has an input and an output connected to the D-type flip-flop clear input. The monitoring lead connects the one-shot input to the latch clock input for switching the logic state of the D-type flip-flop based on change in voltage applied to the monitoring lead.

14 Claims, 5 Drawing Sheets

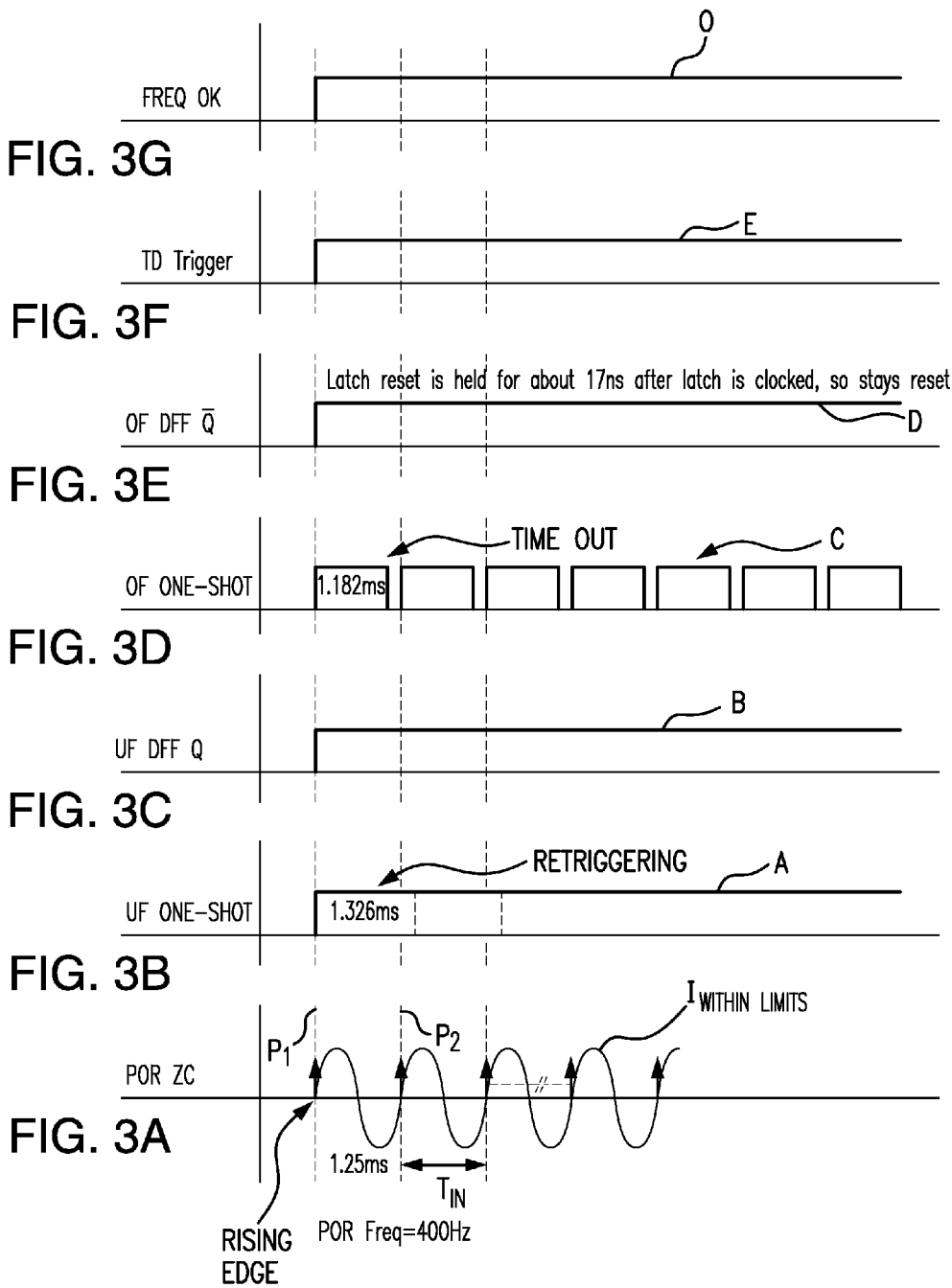

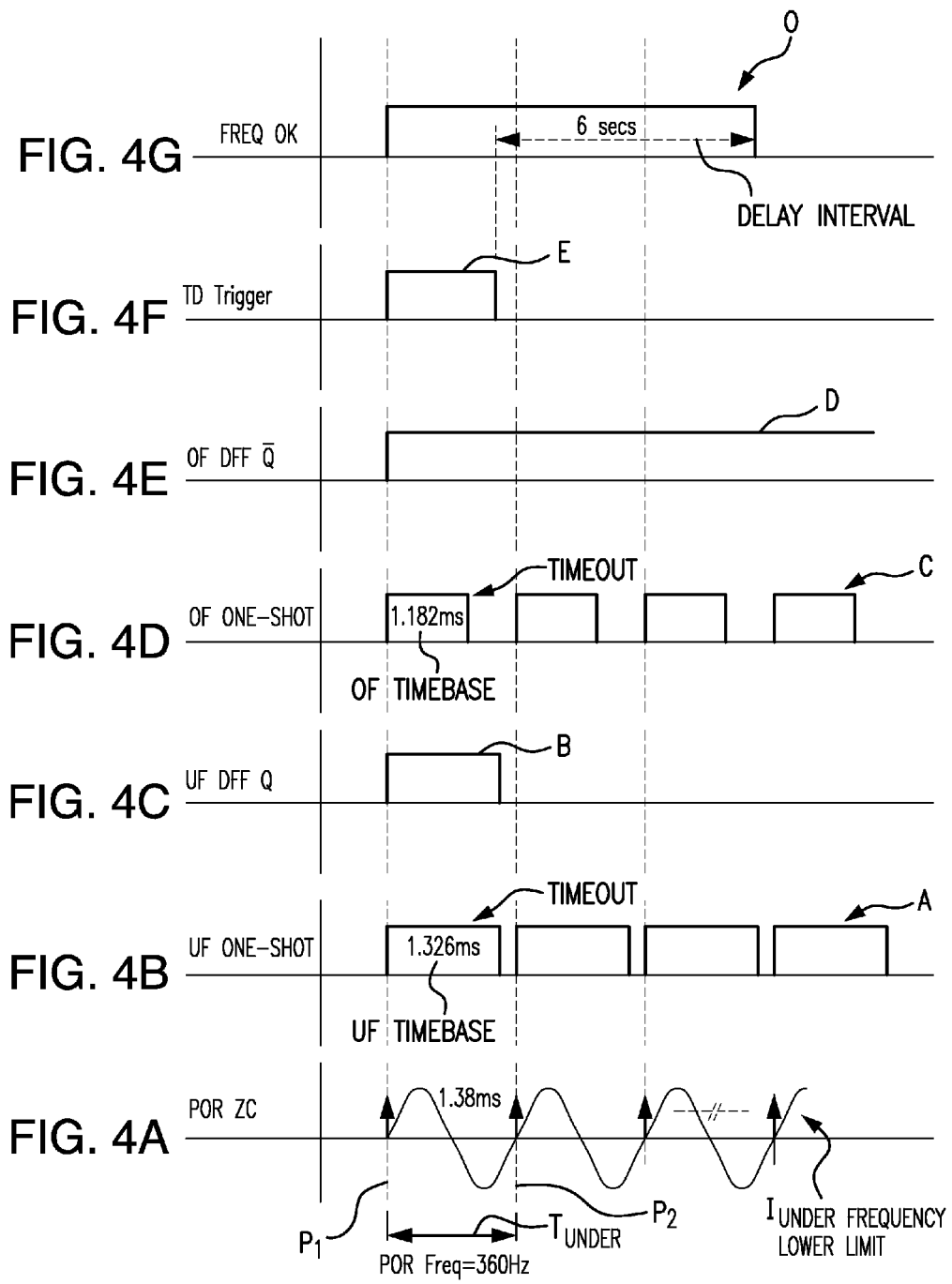

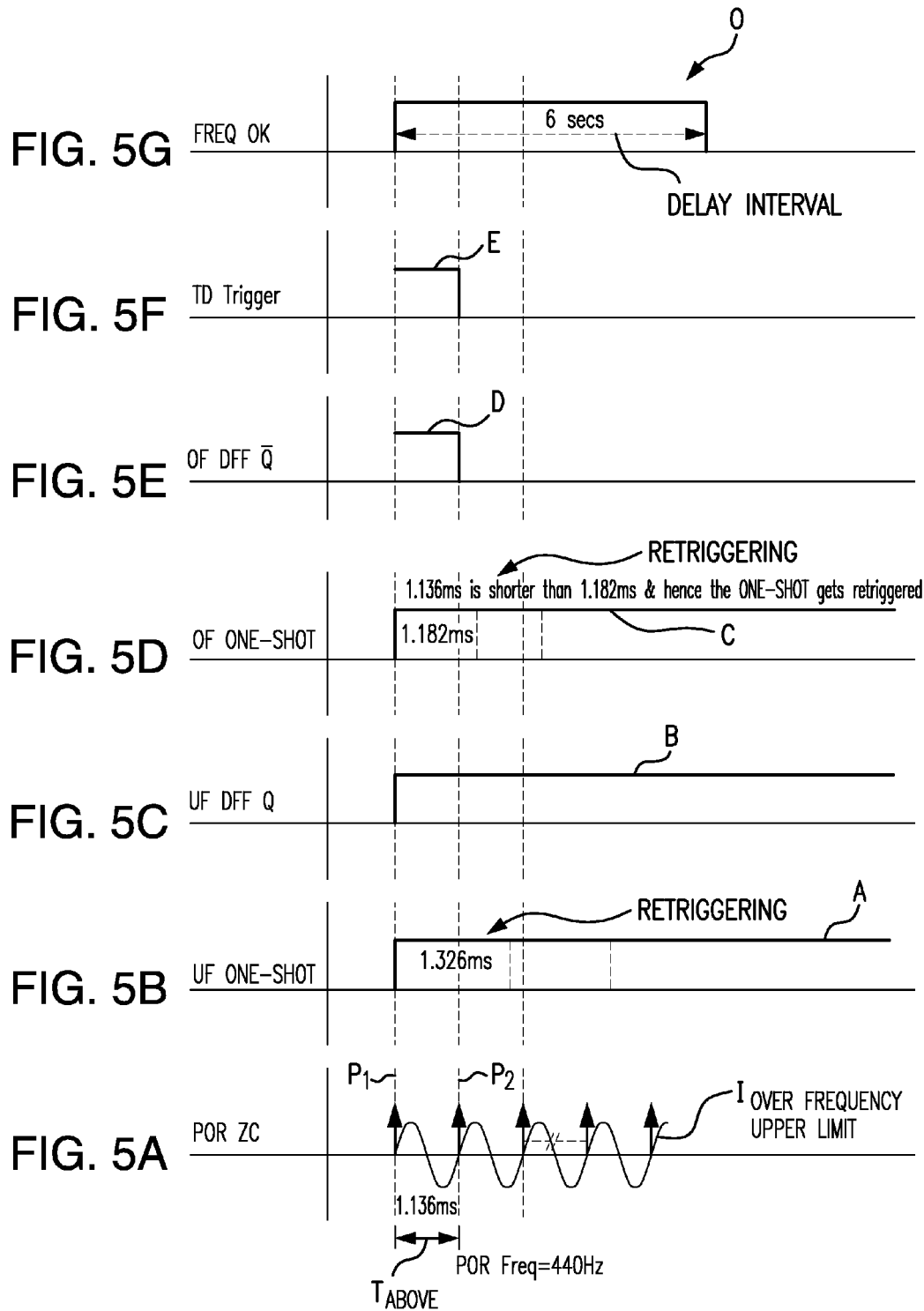

FREQUENCY DETECTION CIRCUITS

BACKGROUND OF THE INVENTION

1. Field of the Invention

The present disclosure relates to frequency detection, and more specifically to frequency detection circuits for control of electrical power and rotating mechanical components.

2. Description of Related Art

Gas turbine engines typically include rotating components like compressors, turbines rotors, and permanent magnet alternators that rotate in relation to stationary components during operation. The performance of such rotating components typically needs to be monitored and controlled for reliable operation. Conventional gas turbines engines typically include measurement, feedback, and control devices that acquire, analyze, and make adjustments based on the acquired measurements. Examples of such mechanisms include controllers running microprocessor-based software or programmable logic controllers. Other examples include capacitor-based circuits that provide frequency measurements based on capacitor charge and discharge events. While each is suitable for its intended purpose, controllers with microprocessor-based software and programmable logic controllers can complicate the certification process associated with some types of products, such as aircraft and aircraft systems due to the complexity of the software and/or logic. While relatively simple for applications requiring certification, capacitors can limit the accuracy of frequency measurement systems to below that required in certain types of applications.

Such conventional methods and systems have generally been considered satisfactory for their intended purpose. However, there is still a need in the art for improved frequency detection devices. The present disclosure provides a solution for this need.

SUMMARY OF THE INVENTION

A frequency monitoring circuit includes a D-type flip-flop (DFF) with a switchable logic state, a clear input, and a clock input. A one-shot with a trigger input and an output that connects to the DFF clear input. A monitoring lead connects to the one-shot trigger input and the DFF clock input for switching the logical state of the DFF based on change in voltage applied to the monitoring lead.

In certain embodiments, the DFF can have a data input and the circuit can include a constant voltage source connected to the data input. The DFF can also include first and second outputs with opposite voltages for applying the DFF output to a pulse qualifier. The pulse qualifier can connect to either of the first and second DFF outputs. It is contemplated that the pulse qualifier can have a time delay set input and that a time delay resistor can be connected between a ground terminal and the time delay set input for setting the pulse qualifier timer.

In accordance with certain embodiments, the one-shot can be a retriggerable one-shot. The one-shot can have a set input and a set resistor connected between the set input and a ground terminal. The one-shot can also have a voltage input. A first resistor can connect between the voltage input and the ground terminal. A second resistor can connect between the voltage input and a voltage source terminal. It is contemplated that the one-shot can have triggered and untriggered states. Resistance of the set resistor can determine duration of the one-shot triggered state. The duration can be less than a predetermined expected interval between rising edges of voltage applied to the monitoring lead. The duration can be greater than a predetermined expected interval between rising edges of voltage applied to the monitoring lead.

In accordance with certain embodiments, the one-shot can be an under-frequency retriggerable one-shot and the circuit can include an over-frequency retriggerable one-shot. The over-frequency retriggerable one-shot can have a monitoring input, a set input, and source voltage input. A set resistor can be connected between a ground terminal and the set input for setting a retrigger delay time. The delay time of the over frequency retriggerable one-shot can be less than a trigger delay time of the under frequency retriggerable one-shot. It is also contemplated that a first resistor can be connected between the voltage input and the ground terminal. A second resistor can be connected between the voltage input and a source voltage terminal.

In accordance with embodiments, the DFF can be an under-frequency latch, the over-frequency retriggerable one-shot can have an output, and the circuit can further include an over-frequency DFF with a data input connected to a voltage source terminal, a clock input connected to the monitoring lead, and a clear input connected to an output of the over-frequency retriggerable one-shot. It is contemplated that both the under-frequency DFF and over-frequency DFF can include first and second outputs, and the gate can connect to the first output of the under-frequency DFF and the second output of the over-frequency DFF. The gate can be an AND gate, for example.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIGS. 3A-3G are output graphs of elements of the circuit shown in FIG. 2, showing outputs of the circuit elements when a monitored operates in within frequency limits condition, e.g. at around 400 hertz, according to an embodiment;

FIGS. 4A-4G are output graphs of elements of the circuit shown in FIG. 2, showing outputs of the circuit elements when the monitored device operates below a lower frequency limit, e.g. at around 360 hertz, according to an embodiment; and FIGS. 5A-5G are output graphs of elements of the circuit shown in FIG. 2, showing outputs of the circuit elements when the monitored device operates above an upper frequency limit, e.g. at around 440 hertz, according to an embodiment.

DETAILED DESCRIPTION OF THE PREFERRED EMBODIMENTS

Figure 1:
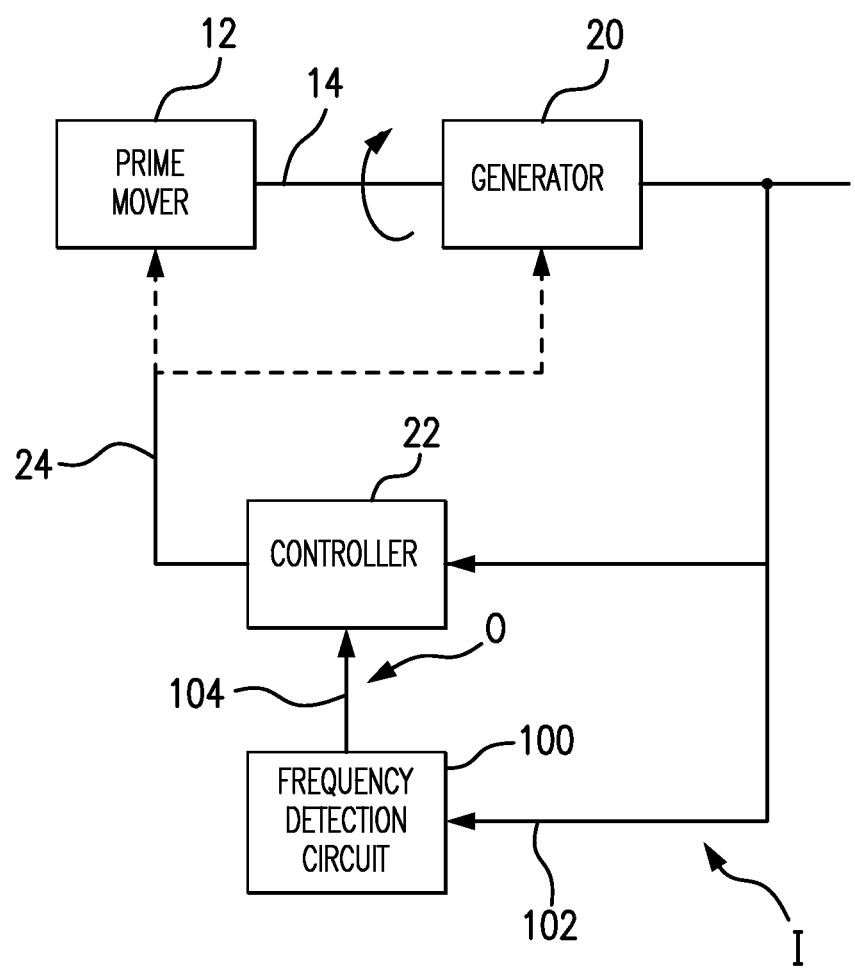
FIG. 1 is a schematic block diagram of an exemplary embodiment of a frequency detection circuit constructed in accordance with the present disclosure, showing a wave generator coupled between a monitored device and a frequency detection circuit.

Reference will now be made to the drawings wherein like reference numerals identify similar structural features or aspects of the subject disclosure. For purposes of explanation and illustration, and not limitation, a partial view of an exemplary embodiment of the frequency detection circuit in accordance with the disclosure is shown in FIG. 1 and is designated generally by reference character 100. Other embodiments of frequency detection circuits in accordance with the disclosure, or aspects thereof, are provided in FIGS. 2-5, as will be described. The systems and methods described herein can be used for monitoring the speed of a rotating mechanical component or the frequency of voltage, such as in aircraft engines or electrical systems for example.

With reference to FIG. 1, a system 10 including frequency detection circuit 100 is shown. System 10 includes a prime mover 12, a shaft 14, a generator 20, and controller 22. Prime mover 12 is operatively associated with rotatable shaft 14 and configured to mechanically rotate shaft 14. Prime mover 12 is operatively associated with shaft 14. Generator 20 is communicative with shaft 14 and is configured to generate a voltage including information indicative of the rotational speed of shaft 14 or of generator 20.

In embodiments, generator 20 is configured to provide a point of regulation sinusoidal input signal I (shown in FIG. 3A) to frequency detection circuit 100. Input signal I includes a plurality of zero crossings separated by a time interval T (shown in FIG. 3A) that are indicative of the frequency of the monitored device, e.g. shaft 14, generator 20, and/or voltage output by generator 20. As will be appreciated, the zero crossings can be rising edges of input signal I or falling edges of input signal I as suitable for an intended application.

Generator 20 is connected frequency detection circuit 100 through a monitoring lead 102. Frequency detection circuit 100 is configured for receiving input signal I through monitoring lead 102, generating an output signal O, and applying output signal O to a circuit output lead 104. Output signal O includes information indicative of whether the rotational speed of shaft 14 or frequency of voltage output by generator 20 is within predetermined lower and upper limits. Controller 22 is configured to receive output signal O and provide control through a feedback loop 24 for controlling the monitored device, e.g. shaft 14 and/or voltage based on output O.

Figure 2:
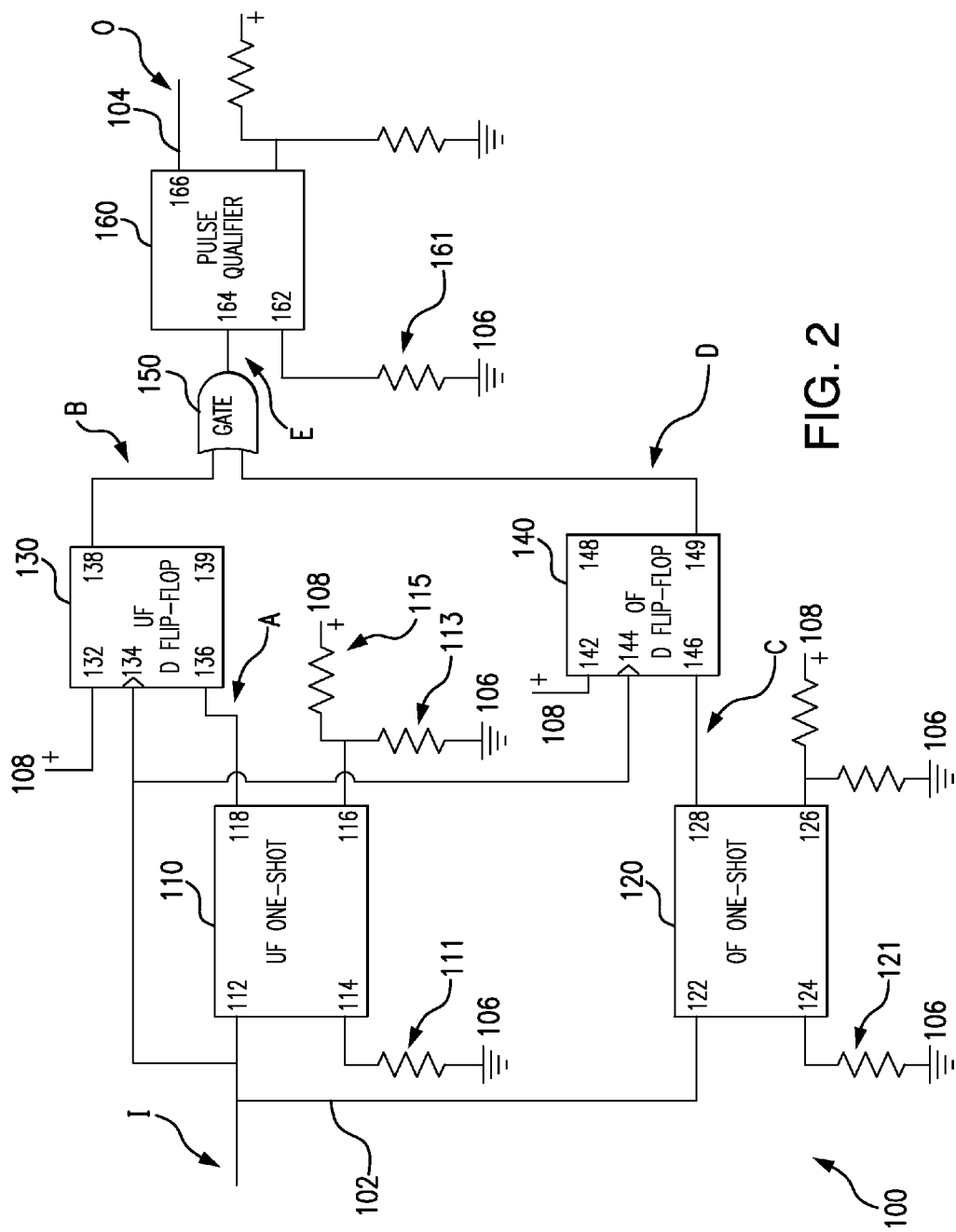
FIG. 2 is a schematic circuit diagram of the frequency detection circuit of FIG. 1, showing the monitoring lead connected to one-shot and D flip-flop devices of the circuit.

With reference to FIG. 2, frequency detection circuit 100 is shown. Frequency detection circuit 100 includes an under frequency (UF) one-shot 110, a UF D-type flip-flop (DFF) 130, an over-frequency (OF) one-shot 120, an OF DFF 140, a gate 150, and a pulse qualifier 160. Monitoring lead 102 connects each of UF one-shot 110, UF DFF 130, OF one-shot 150, and OF DFF 170 with generator 20 (shown in FIG. 1) for providing input signal I to coincidentally thereto. UF one-shot 110 is connected to a clear input 136 of UF DFF 130. OF one-shot 120 is connected to a clear input 146 of OF DFF 140. Respective Q and Q outputs of UF DFF 130 and OF DFF 140 are connected to gate 150. Gate 150 is connected to pulse qualifier 160. Pulse qualifier 160 is connected to controller 22 (shown in FIG. 1) through circuit output lead 104.

UF one-shot 110 has a trigger input 112, a set input 114, a voltage input 116, and an output 118. Monitoring lead 102 connects to trigger input 112. A UF pulse width set resistor 111 connects between set input 114 and a ground terminal 106 for establishing a trigger interval of UF one-shot 110. A second UF resistor 113 connects between voltage input 116 and ground terminal 106 and a third UF resistor 115 connects between voltage input 116 and a voltage source terminal 108 for rendering voltage available from voltage terminal 108 suitable to set the range of a pulse width set by resistor 111. In embodiments, UF one-shot 110 is retriggerable monostable multivibrator with rising edge input polarity. Examples of suitable retriggerable monostable retriggerable multivibrators include part number LTC6993-2, available from Linear Technology Corporation of Milpitas, Calif.

UF pulse width set resistor 111 has a resistance corresponding to a predetermined lower frequency limit for the monitored device connected through monitoring lead 102. Resistance of pulse width resistor 111 establishes a retrigger interval of UF one-shot 110, i.e. a time interval following receipt of an edge after which a subsequent edge must be received in order for an output signal A applied by UF one-shot 110 to output 118 to remain high. Absent receipt of a subsequent edge, UF one-shot output A goes low. Resistance of pulse width set resistor 111 selected such that successive retriggers of UF one-shot 110 are indicative the monitored device is operating above a predetermined lower frequency limit. As will be appreciated, tolling of the trigger interval without a retrigger indicates that the monitored device is operating at a frequency below that of the predetermined lower frequency limit.

OF one-shot 120 is similar to UF one-shot 110 with two differences. First, an OF pulse width set resistor 121 connected between ground terminal 106 and a set input 124 has a different resistance that that of UF pulse width set resistor 111. Second, output 128 of OF one-shot 120 connects to a clear input 146 of OF DFF 140. With respect to the first difference, resistance of OF pulse width set resistor 121 is selected such that successive retriggers of OF one-shot 120 indicate that the monitored device is operating above a predetermined upper frequency limit. With respect the second difference, OF one-shot 120 provides an output signal C to clear input 146 of OF DFF 140 that is different from output signal A for a common input signal I received at trigger input 112 of UF one-shot 110 and trigger input 122 of OF one-shot 120.

With continuing reference to FIG. 2, UF DFF 130 has a set input 132, a clock input 134, a clear input 136, and first and second outputs 138 and 39. Set input 132 connects to voltage source terminal 108. Clock input 134 connects to monitoring lead 102. Clear input 136 connects to output 118 of UF one-shot 110. First output 138 connects to a logical gate 150. Second output 139 is not used by frequency detection circuit 100. UF DFF 130 has a logical state indicated with relative voltage differential between first and second outputs 138 and 139, i.e. complementary voltages applied to first and second outputs 138 and 139, which form UF DFF output signal B. As will be appreciated, one of the first and second outputs 138 and 139 is high and the other is low for a given logical state. In embodiments, UF DFF 130 is a D-type flip-flop wherein set input 132 is a data input. An example of a suitable D-type flip-flop is part number SN74LVC2G74, available from Texas Instruments Inc. of Dallas, Tex.

OF DFF 140 is similar to UF DFF 130 with the differences that a clear input 146 is connected to output 128 of OF one-shot 120 and a second output 149 of OF DFF 140 is connected to gate 150. In this respect, retriggering OF one-shot 120 has the opposite effect as retriggering of UF one-shot 110 than retriggering UF one-shot 30 as first output 138 and second output 139 have opposite outputs, i.e.

second output 139 goes low when first output 138 goes high and vice versa. OF DFF 140 provides an OF DFF output signal D to gate 150.

Gate 150 has a first input, a second input, and an output. The first input of gate 150 is connected to first output 138 of UF DFF 138, the second input of gate 150 is connected to second output 149 of OF DFF 140, and the output of gate 150 is connected to pulse qualifier 160. Gate 150 is an AND gate. In this respect, a gate output signal E generated by gate 150 is high when UF DFF output signal B and OF DFF output signal D are each high. Otherwise, gate output E is low, i.e. when either or both of UF DFF output signal B and OF DFF output signal D are low.

Pulse qualifier 160 has an input 164, an output 166, and a set input 162. Input 164 is connected to gate 150. Output 166 is connected to circuit output lead 104. A time base set resistor 161 connects between set input 162 and ground terminal 106. Time base set resistor 161 has a set resistance that establishes a delay interval of pulse qualifier 160. The delay interval is a period of time subsequent to gate output signal E going low after which output signal O of frequency detection circuit 100 goes low. Output signal O going low indicates that the monitored frequency has been outside of the predetermined lower and upper frequency limits for a time interval greater than the delay interval set by resistor 161. This allows frequency detection circuit 100 to tolerate a threshold amount of out-of-limits frequency performance prior to indicating the performance change output signal O. In this respect, it defines a grace period within which the monitored device, e.g. shaft 14 or generator 20, can return to within the predetermined speed and/or frequency limits.

With reference to FIG. 3A, input signal I is shown with a frequency that is within a predetermined lower and upper frequency limit of the monitored device, e.g. shaft 14 or voltage output by generator 20. In the illustrated example, the predetermined upper limit is about 423 hertz (corresponding to intervals of rising edges of about 1.182 milliseconds) and the predetermined lower limit is 377 hertz (corresponding to intervals of rising edges of about 1.326 milliseconds). In view of these limits, UF pulse width set resistor 111 is configured with resistance such that the retrigger interval of UF one-shot 110 is 1.326 milliseconds (shown in FIG. 3B). Analogously, OF pulse width set resistor 121 is configured with resistance such that the retrigger interval of OF one-shot 120 is 1.182 milliseconds (shown in FIG. 3D). Those skilled in the art will readily appreciate that these limits and intervals are exemplary only, and any other suitable selectable limits or intervals can be used.

A first rising edge $P_1$ (shown in FIG. 3A) triggers UF one-shot 110 and OF one-shot 120. This causes UF one-shot output signal A (shown in FIG. 3B) and OF one-shot output signal D (shown in FIG. 3D) to go high. A second rising edge $P_2$ arrives afterwards after the OF one-shot trigger interval (shown in FIG. 3D) tolls but prior to the toll of the UF one-shot trigger interval (shown in FIG. 3B). Since the reset of OF DFF 110 is held low or asserted while the DFF is clocked, the DFF remains reset and OF DFF output signal D (shown in FIG. 3E) remains high. Since UF one-shot 110 is retriggered, UF DFF output signal B also remains high due to clocking the state of data input 132 of UF DFF 130.

As both UF DFF output signal B (shown in FIG. 3C) and OF DFF output signal E (shown in FIG. 3F) remain high, both inputs to gate 150 (shown in FIG. 2) remain high, and gate output signal E (shown in FIG. 3F) remains high. This causes pulse generator 160 (shown in FIG. 2) to apply a high output to circuit output lead O (shown in FIG. 3G), indicating that the frequency of the monitored device, e.g. the rotational speed shaft 14 or the frequency of voltage output by generator 20, is within the predetermined limits.

With reference to FIG. 4A, input signal I is shown with a frequency that is below the predetermined lower limit of the monitored device, e.g. shaft 14 or current source 16. A first rising edge $P_1$ triggers UF one-shot 110 and OF one-shot 120, causing UF one-shot output signal A (shown in FIG. 4B) and OF one-shot output signal D (shown in FIG. 4D) to go high. This causes UF DFF output signal B (shown in FIG. 4C) and OF DFF output signal D (shown in FIG. 4E) to each go high. Responsive thereto, gate output signal F (shown in FIG. 4F) and pulse qualifier 160 generates a circuit output signal O that is high, indicating that the frequency of the monitored device, e.g. shaft 14 or current source 16, is within the predetermined limits.

A second rising edge $P_2$ of input signal I (shown in FIG. 4A) arrives 1.38 milliseconds after first rising edge $P_1$ (corresponding with an actual shaft speed or voltage frequency of about 360 hertz). Since second rising edge $P_2$ arrives after the retrigger intervals of UF one-shot 110 and OF one-shot 120 respectively, UF one-shot output signal A (shown in FIG. 4B) and OF one-shot output signal C (shown in FIG. 4C) go low. The conditions of OF DFF 140 (shown in FIG. 2) are similar to the conditions of the "within limits" scenario (shown in FIG. 3D and FIG. 3E). Hence, output signal D of OF DFF 140 remains high (shown in FIG. 4E). Output A of UF one-shot 110 is in the tolled (low)) state. This forces UF DFF 130 into a reset state, and which persists, since UF DFF 130 is clocked while held in reset. This in turn causes gate output signal E (shown in FIG. 4F) to go low, starting the delay interval of pulse qualifier 160. Once the delay interval of pulse qualifier 160 tolls, circuit output signal O (shown in FIG. 4G) goes low. This provides indication through circuit output signal O the frequency of the monitored device, e.g. the rotational speed of shaft 14 and/or voltage frequency of output voltage of generator 20, is outside of the predetermined limits.

With reference to FIG. 5A, input signal I is shown with a frequency that is above the predetermined upper limit of the monitored device. A first rising edge $P_1$ triggers UF one-shot 110 and OF one-shot 120, causing UF one-shot output signal A (shown in FIG. 5B) and OF one-shot output signal D (shown in FIG. 5D) to go high. This causes UF DFF output signal B (shown in FIG. 5C) and OF DFF output signal D (shown in FIG. 5E) to go high. Responsive thereto, gate output signal F (shown in FIG. 5F) and pulse qualifier 160 generate a circuit output signal O that is high, indicating that the frequency of the monitored device, e.g. rotational speed of shaft 14 or output voltage frequency of generator 20, is within the predetermined limits.

A second rising edge $P_2$ of input signal I (shown in FIG. 5A) arrives 1.136 milliseconds after first rising edge $P_1$. Since $P_2$ arrives before the retrigger intervals of both UF one-shot 110 and OF one-shot 120, they do not time out, and instead both clock in their respective input state upon when the pulse arrives at respective their data inputs (data input 132 of UF DFF 130 and data input 142 of OF DFF 140). This in turn causes gate output signal E (shown in FIG. 5F) to go low, starting starts the delay interval of pulse qualifier 160. Once the delay interval of pulse qualifier 160 tolls, circuit output signal O (shown in FIG. 5G) goes low. This provides indication through circuit output signal O the frequency of the monitored device, e.g. rotational speed of shaft 14 or output voltage frequency of generator 20, is outside of the predetermined limits.

As will be appreciated, in the event that subsequent pulses arrive within the delay interval of pulse qualifier 160, circuit output signal O remains high—indicating that the frequency of the monitored device, e.g. rotational speed of shaft 14 and/or frequency of voltage output by generator 20 is within limits. This allows frequency detection circuit 100 to tolerate noise in input signal I. Moreover, since the delay interval of pulse qualifier 160 is configurable based on resistance of time base set resistor 161, pulse qualifier 160 can also be configured to match the sensitivity of frequency detection circuit 100 to a given application.

The methods and systems of the present disclosure, as described above and shown in the drawings, provide for frequency detection circuits with superior properties including simplified construction. The simplified construction can allow for relatively quick certification owing to absence of software, microprocessors, or programmable logic device. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A frequency detection circuit, comprising:
   an under-frequency D-type flip-flop with a switchable logic state, a clear input, and a clock input;
   a one-shot with a trigger input and an output, wherein the one-shot output is connected to the under-frequency D-type flip-flop clear input;
   a monitoring lead connecting the trigger input of the one-shot and the clock input of the under-frequency D-type flip-flop to switch the logical state of the under-frequency D-type flip-flop based on change in voltage applied to the monitoring lead,
   wherein the under-frequency D-type flip-flop has a set input, and further including a voltage source terminal connected to the under-frequency D-type flip-flop set input for setting a logic level of a latch, wherein the latch is an under-frequency latch; and
   an over-frequency D-type flip-flop with a clock input and a set input,
   wherein the over-frequency D-type flip-flop clock input is connected to the monitoring lead and set input is connected to the voltage source terminal for setting a logical high.

2. The circuit as recited in claim 1, wherein the set input is a data input of the under-frequency D-type flip-flop.

3. The circuit as recited in claim 2, wherein the under-frequency D-type flip-flop and over-frequency D-type flip-flop include a first output and a second output, and further including a gate connected to the first output of the under-frequency D-type flip-flop and the second output of the over-frequency D-type flip-flop.

4. The circuit as recited in claim 3, wherein the gate has an output, and further including a pulse qualifier connected to the gate output.

5. The circuit as recited in claim 4, wherein the pulse qualifier is configured for tolerating excursion from a predetermined frequency range for predetermined time interval.

6. The circuit as recited in claim 4, wherein the pulse qualifier has a set input, and further including a time base set resistor connected between the set input and the ground terminal.

7. The circuit as recited in claim 6, wherein a delay interval determined by resistance of the time base set resistor, wherein output of the pulse qualifier changes following the delay interval and voltage change applied at the gate output.

8. The circuit as recited in claim 1, wherein pulse width timing of the one-shot is determined by a pulse width set resistor.

9. The circuit as recited in claim 8, wherein the pulse width set resistor defines a one-shot set interval, wherein the set interval is less than an expected interval between expected edges of voltage applied to the monitoring lead.

10. The circuit as recited in claim 9, wherein the pulse width set resistor defines a one-shot set interval, wherein the set interval is greater than an expected interval between expected edges of voltage applied to the monitoring lead.

11. The circuit as recited in claim 9, wherein the one-shot is a retriggerable under-frequency one-shot, and further including a retriggerable over-frequency one-shot with a trigger input, wherein the trigger input is connected to the monitoring lead.

12. The circuit as recited in claim 11, wherein the retriggerable over-frequency and under-frequency one-shots each have a set interval, wherein the set interval of the under-frequency one is greater than the set interval of the over-frequency one-shot.

13. A frequency detection circuit, comprising:
   an under-frequency one-shot;
   an under-frequency D-type flip-flop with a logical state connected to the under-frequency one-shot;
   a pulse qualifier connected to the under-frequency D-type flip-flop;
   an over-frequency D-type flip-flop with a logical state connected to the pulse qualifier;
   an over-frequency one-shot connected to the over-frequency D-type flip flop; and
   a monitoring lead connecting the under-frequency one-shot, the over-frequency one-shot, the under-frequency D-type flip-flop, and the over-frequency D-type flip-flop for switching the over-frequency D-type flip-flop logical state when a detected frequency falls below a predetermined lower frequency limit and switching the under-frequency D-type flip-flop logical state when the detected frequency exceeds a predetermined upper frequency limit,
   wherein the under-frequency D-type flip-flop has a set input, and further including a voltage source terminal connected to the D-type flip-flop set input for setting a logic level of a latch, the latch being an under-frequency latch; and
   wherein the over-frequency D-type flip-flop has a clock input and a set input, the under-frequency D-type flip-flop clock input being connected to the monitoring lead and the under-frequency D-type flip-flop set input being connected to the voltage source terminal for setting a logical high.

14. The circuit as recited in claim 1, wherein the monitoring lead is a single monitoring lead electrically connected to both (a) the trigger input of the one-shot, and (b) the clock input of the D-type flip-flop.

* * * * *